US009136822B2

(12) United States Patent
Rogers

(10) Patent No.: US 9,136,822 B2
(45) Date of Patent: Sep. 15, 2015

(54) MICROELECTROMECHANICAL SYSTEM WITH A MICRO-SCALE SPRING SUSPENSION SYSTEM AND METHODS FOR MAKING THE SAME

(71) Applicant: HARRIS CORPORATION, Melbourne, FL (US)

(72) Inventor: John E. Rogers, Gainesville, FL (US)

(73) Assignee: Harris Corporation, Melbourne, FL (US)

(*) Notice: Subject to any disclaimer, the term of this patent is extended or adjusted under 35 U.S.C. 154(b) by 165 days.

(21) Appl. No.: 13/970,209

(22) Filed: Aug. 19, 2013

(65) Prior Publication Data
US 2015/0048903 A1 Feb. 19, 2015

(51) Int. Cl.
H03H 9/46 (2006.01)
H03H 9/52 (2006.01)
(Continued)

(52) U.S. Cl.
CPC .............. *H03H 9/462* (2013.01); *B81B 7/0016* (2013.01); *H01G 5/16* (2013.01); *H03H 9/525* (2013.01); *B81B 2201/0271* (2013.01)

(58) Field of Classification Search
CPC ............... B81B 7/0016; B81B 2203/0145; B81B 2203/1263; B81B 2203/0172; B81B 2203/04; B81B 2207/015; B81B 2207/03; B81B 2207/07; B81B 2207/091; B81B 2207/098; B81B 2207/11; B81B 2201/0271; H01H 3/60; B81C 1/00166; B81C 1/00222; B81C 1/00246; B81C 2203/0721; B81C 2203/0792; H03H 3/0072; H03H 3/0073; H03H 2007/006; H03H 9/02244; H03H 9/02338; H03H 9/02433; H03H 9/0542; H03H 9/0547; H03H 9/0595; H03H 9/465; H03H 9/485; H03H 9/505; H03H 9/525; H03H 9/462; H01G 5/16

USPC ......................................................... 333/186
See application file for complete search history.

(56) References Cited

U.S. PATENT DOCUMENTS 5,536,988 A * 7/1996 Zhang et al. .................. 310/309
5,959,516 A 9/1999 Chang et al.
(Continued)

FOREIGN PATENT DOCUMENTS

EP 1760731 3/2007
EP 1 785 391 A2 5/2007
(Continued)

OTHER PUBLICATIONS

International Search Report and Written Opinion issued Nov. 18, 2014, in Application No. PCT/US2014/049668.
(Continued)

*Primary Examiner* — Barbara Summons
(74) *Attorney, Agent, or Firm* — Robert J. Sacco, Esq.; Fox Rothschild LLP

(57) ABSTRACT

Integrated Microelectromechanical System ("MEMS") devices and methods for making the same. The MEMS devices comprise a substrate (200) and a MEMS filter device (100) mechanically suspended above a major surface of the substrate. A first gas gap (202) exists between the major surface of the substrate and the MEMS filter device. An isolation platform (600) is provided to absorb vibrations from an external environment prior to reaching the MEMS filter device. In this regard, the isolation platform comprises: a frame structure (610) framing a periphery of the MEMS filter device; and at least one resilient component (612-618) coupled between the frame structure and the MEMS filter device. The frame structure is mechanically connected to the substrate. Electronic circuitry is connected to the MEMS filter device via a resilient interconnection (204, 206) that is movable in at least one direction of the vibrations.

21 Claims, 14 Drawing Sheets

(51) Int. Cl.
    *B81B 7/00* (2006.01)
    *H01G 5/16* (2006.01)

(56) References Cited

U.S. PATENT DOCUMENTS

| | | |
|---|---|---|
| 6,127,767 A | 10/2000 | Lee et al. |
| 6,133,670 A | 10/2000 | Rodgers et al. |
| 6,310,526 B1 | 10/2001 | Yip et al. |
| 6,360,033 B1 | 3/2002 | Lee et al. |
| 6,497,141 B1 | 12/2002 | Turner et al. |
| 6,611,168 B1 | 8/2003 | Denison et al. |
| 6,621,390 B2 | 9/2003 | Song et al. |
| 6,661,069 B1 | 12/2003 | Chinthakindi et al. |
| 6,853,534 B2 | 2/2005 | Williams |
| 6,975,193 B2 | 12/2005 | Knieser et al. |
| 7,012,489 B2 | 3/2006 | Sherrer et al. |
| 7,091,647 B2 | 8/2006 | Jerman |
| 7,148,772 B2 | 12/2006 | Sherrer et al. |
| 7,251,466 B2 | 7/2007 | Porret et al. |
| 7,304,556 B2 | 12/2007 | Tamura et al. |
| 7,598,836 B2 | 10/2009 | Lee |
| 7,732,975 B1 | 6/2010 | Hobbs et al. |
| 7,755,174 B2 | 7/2010 | Rollin et al. |
| 7,858,422 B1 | 12/2010 | Quevy et al. |
| 7,898,356 B2 | 3/2011 | Sherrer et al. |
| 7,933,112 B2 | 4/2011 | Ayazi et al. |
| 7,977,136 B2 | 7/2011 | Ayazi et al. |
| 8,039,922 B2 | 10/2011 | Ni |
| 8,276,259 B1 | 10/2012 | Findley et al. |
| 8,373,522 B2 | 2/2013 | Rogers |
| 8,860,114 B2 | 10/2014 | Yen et al. |
| 8,900,994 B2 | 12/2014 | Yu et al. |
| 2001/0001550 A1* | 5/2001 | Bryzek et al. ............ 338/36 |
| 2002/0130586 A1 | 9/2002 | Mao et al. |
| 2003/0020561 A1 | 1/2003 | Qiu et al. |
| 2003/0102936 A1 | 6/2003 | Schaefer |
| 2003/0155221 A1 | 8/2003 | Kawai |
| 2003/0184413 A1 | 10/2003 | Nguyen |
| 2004/0104449 A1 | 6/2004 | Yoon et al. |
| 2004/0189142 A1 | 9/2004 | Knieser et al. |
| 2005/0073380 A1 | 4/2005 | Howell et al. |
| 2005/0088255 A1 | 4/2005 | Sengupta et al. |
| 2005/0264384 A1 | 12/2005 | Simon et al. |
| 2006/0003482 A1 | 1/2006 | Chinthakindi et al. |
| 2006/0087390 A1 | 4/2006 | Yuba et al. |
| 2006/0238279 A1 | 10/2006 | Lu et al. |
| 2006/0261702 A1 | 11/2006 | Harada et al. |
| 2008/0157627 A1 | 7/2008 | Kato et al. |
| 2009/0058569 A1 | 3/2009 | Sherrer et al. |
| 2009/0114513 A1 | 5/2009 | Kim et al. |
| 2010/0091372 A1 | 4/2010 | Yamanoi et al. |
| 2011/0102105 A1 | 5/2011 | Rogers |
| 2011/0148525 A1 | 6/2011 | Herrera |
| 2011/0188168 A1 | 8/2011 | Rogers |
| 2011/0198202 A1 | 8/2011 | Rogers |
| 2011/0204969 A1 | 8/2011 | Chen et al. |
| 2013/0049888 A1 | 2/2013 | Ruby |
| 2013/0194770 A1 | 8/2013 | Bernstein et al. |
| 2013/0285171 A1* | 10/2013 | Najafi et al. ............ 257/415 |
| 2013/0328140 A1* | 12/2013 | Potasek et al. .......... 257/415 |
| 2015/0048901 A1 | 2/2015 | Rogers |
| 2015/0048902 A1 | 2/2015 | Rogers |
| 2015/0048903 A1 | 2/2015 | Rogers |

FOREIGN PATENT DOCUMENTS

| | | |
|---|---|---|
| EP | 1973190 | 9/2008 |
| WO | 0007218 | 2/2000 |
| WO | 02/080279 | 10/2002 |
| WO | 2008123525 A1 | 10/2008 |
| WO | 2010054889 A1 | 5/2010 |
| WO | 2011053888 | 5/2011 |
| WO | 2011097093 | 8/2011 |

OTHER PUBLICATIONS

International Search Report and Written Opinion mailed Nov. 18, 2014, in Application PCT/US2014/049667.

International Search Report and Written Opinion mailed Oct. 31, 2014, in Application PCT/US2014/049664.

Bunch, R.L. et al., "Quality Factor and Inductance in Differential IC Implementations," IEEE Microwave Magazine, vol. 3, No. 2, Jun. 1, 2002, pp. 82-92.

Huang, T. et al., "5-GHz Low Phase-Noise CMOS VCO Integrated with a Micromachined Switchable Differential Inductor," IEEE Microwave and Wireless Components Letters, IEEE Service Center, New York, NY, US, vol. 18, No. 5, May 1, 2008, pp. 338-340.

Leblond, H. et al., "On-Chip Spiral Inductors and Metal-Air-Metal Capacitors in Suspended Technology," 2006 European Microwave Conference, Sep. 1, 2006, pp. 44-47.

Legtenberg, R. et al., "Comb-Driven actuators for Large Displacement," J. of Micromechanics and Microengineering, vol. 6, pp. 320-329, 1996 IOP Publishing Ltd.

Tas N.R., et al.: "Technical Note; Design, Fabrication and Test of Laterally Driven Electrostatic Motors Employing Walking Motion and Mechanical Leverage" Journal of Micromechanics & Microengineering, Institute of Physics Publishing, Bristol, GB, vol. 13, No. 1, Jan. 1, 2003, pp. N6-N15, XP020068883.

Rogers, John E., et al.: "Bi-Directional Gap Closing MEMS Actuator Using Timing and Control Techniques", IEEE Industrial Electronics, IECON 2006—32nd Annual Conference on, IEEE, Piscataway, NJ, USA, Nov. 1, 2006, pp. 3149-3154, XP031077518.

Harris Corporation, International Search Report dated Mar. 16, 2011; Application Serial No. PCT/US2010/054889.

International Search Report mailed Oct. 7, 2011 in Application Serial No. PCT/US2011/022483 in the name of Harris Corporation.

International Search Report mailed Mar. 5, 2012; Application Serial No. PCT/US2011/023321, in the name of Harris Corporation.

Yalcinkaya, A.D., "Low Voltage High-Q SOI MEMS Varactors fro RF Applications"; 2003 IEEE Proceedings of the 29th European Solid-State Circuits Conference, ESSCIRC '03, Sep. 16-18, 2003, pp. 607-610, with one IEEE Xplore abstract page.

Fedder, G.K., "Tunable RF and Analog Circuits Using on-Chip MEMS Passive Components"; 2005 IEEE International Solid-State Circuits Conference, ISSCC 2005, Feb. 9, 2005, Digest of Technical Papers, pp. 390-391.

* cited by examiner

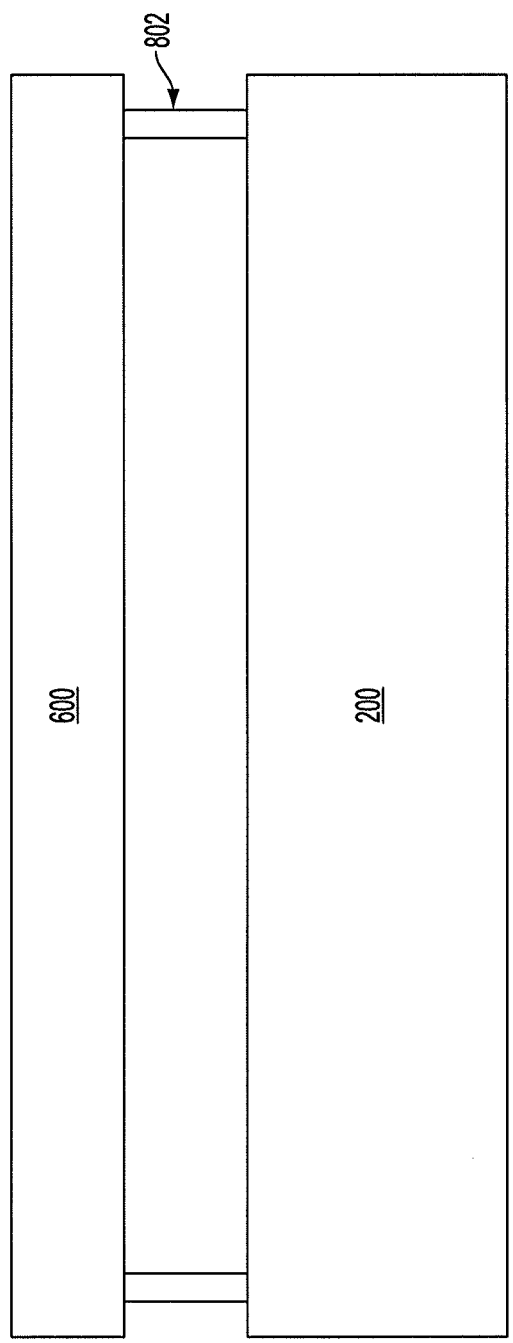

US 9,136,822 B2

MICROELECTROMECHANICAL SYSTEM WITH A MICRO-SCALE SPRING SUSPENSION SYSTEM AND METHODS FOR MAKING THE SAME

BACKGROUND OF THE INVENTION

1. Statement of the Technical Field

The inventive arrangements relate to Microelectromechanical System ("MEMS") and methods for forming the same, and more specifically to micro-scale spring suspension systems for MEMS devices.

2. Description of the Related Art

MEMS is a technology of very small devices between 2 micrometers to 2 millimeters in size. The MEMS devices can include one or more components between 1 to 100 micrometers in size. Conventional MEMS devices are fabricated using molding techniques, plating techniques, wet etching techniques, dry etching techniques, and/or Electro Discharge Machining ("EDM") techniques. Various materials can be used to create the MEMS devices. Such materials include silicon, polymers, metals and ceramics.

Radio Frequency ("RF") filters typically occupy a relatively large amount of real estate in an RF system (i.e., >25%). RF filters often comprise varactor devices, such as Gap Closing Actuator ("GCA") varactors. GCA varactors generally operate on the principle of electrostatic attraction between adjacent interdigitating fingers of a drive comb structure and a movable truss comb structure. That is, motion of the truss comb structure can be generated by developing a voltage difference between the drive comb structure and the truss comb structure. The voltages applied at comb structures are also seen at the interdigitating fingers, respectively. The resulting voltage difference generates an attractive force between the interdigitating fingers. If the generated electrostatic force between the fingers is sufficiently large to overcome the other forces operating on truss comb structure (such as a spring constant of a resilient component), the electrostatic force will cause the motion of the truss comb structure between a first interdigitated position (resting position at a zero voltage difference) and a second interdigitated position (position at a non-zero voltage difference) among a motion axis. Once the voltage difference is reduced to zero, a resilient component (e.g., a spring) restores the position of the truss comb structure to the first interdigitated position.

In such a varactor device, there is tradeoff between the mechanical spring stiffness and the actuation of the voltage required to move the truss comb structure. Specifically, the stiffer the spring the higher the voltage needed to move the truss comb structure. Therefore, the actuation voltage can be dramatically lowered by lowering the resilient component (e.g., a spring) stiffness. However, this makes the system more susceptible to external vibrations which may cause damage to the circuit and/or cause undesired performance. In industry, the problem is usually avoided by making the resilient component (e.g., a spring) sufficiently stiff and adding boost electronics to get the desired high voltage. This solution is undesirable because (1) high voltage electronics can be dangerous in certain applications (e.g., in-vivo biomedical applications) and (2) the boost electronics occupy a relatively large amount of space on an RF circuit board.

SUMMARY OF THE INVENTION

The present invention concerns systems and methods for making an integrated MEMS device. The integrated MEMS device comprises a MEMS filter device mechanically suspended above a major surface of a substrate. A first gas gap exists between the major surface of the substrate and the MEMS filter device. An isolation platform is provided to absorb vibrations from the environment prior to reaching the MEMS filter device. In this regard, the isolation platform is mechanically connected to the substrate and comprises a frame structure framing a periphery of the MEMS filter device. At least one resilient component is coupled between the frame structure and the MEMS filter device. External systems are coupled to the MEMS filter device via a resilient interconnection that is movable in at least one direction of the vibrations.

In some scenarios, the MEMS filter further comprises a first transition portion having a first portion passing through at least one aperture formed through the frame structure of the isolation platform. A second gas gap exists between the first portion of the first transition portion and the sidewalls of the aperture formed through the frame structure. A second transition portion is connected to and at least partially extends transversely away from a major surface of the substrate. The second transition portion is electrically connected to the first transition portion via a resilient interconnection. As such, the MEMS filter device is mechanically suspended above said major surface of the substrate by the isolation platform and the resilient interconnection formed between the first and second transition portion.

BRIEF DESCRIPTION OF THE DRAWINGS

Embodiments will be described with reference to the following drawing figures, in which like numerals represent like items throughout the figures, and in which:

FIG. 8 is a schematic illustration of an isolation platform mechanically coupled to a substrate that is useful for understanding the present invention.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

The present invention generally concerns MEMS devices which may or may not be integrated with ICs. The MEMS devices can be used in a variety of applications. Such applications include, but are not limited to, multi-band communication system applications, radar applications, wide-band tracking receiver applications, broadcast radio applications, television applications, and/or wireless communication device applications (e.g., cellphone applications). The MEMS devices include, but are not limited to, RF filters configured to combine and/or separate multiple frequency bands, as well as tunable phase shifters.

Figure 1:
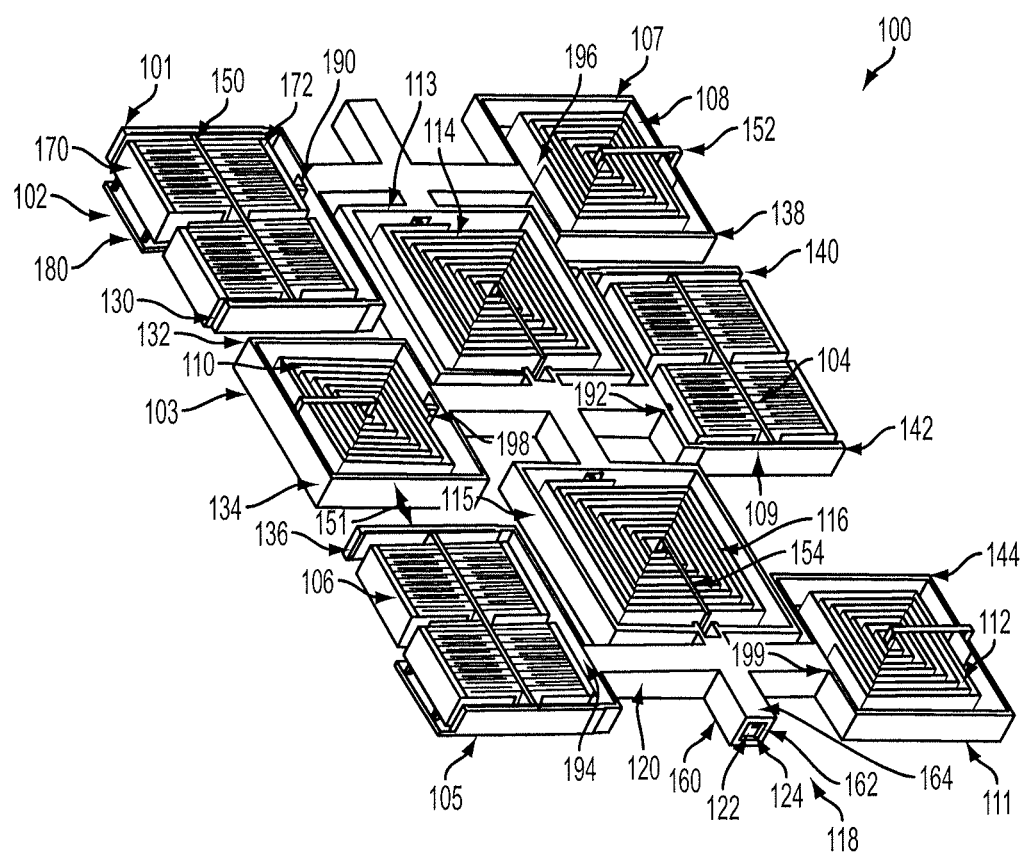
FIG. 1 is a top perspective view of an exemplary MEMS RF filter that is useful for understanding the present invention.

A schematic illustration of an exemplary RF filter 100 is provided in FIG. 1. In some scenarios, the RF filter 100 comprises a 3-pole tunable bandpass filter designed to select a desired band of frequencies for a particular frequency range (e.g., the 1060-1370 MHz range). Embodiments of the present invention are not limited to 3-pole tunable bandpass filter architectures. The RF filter 100 can include any type of filter architecture suitable for a particular application or number of poles necessary for desired bandwidth. Notably, the tunable feature of the RF filter 100 offers significant size reduction over switch-type RF bandpass filter banks.

As shown in FIG. 1, the RF filter 100 is implemented using three shunt varactors 102, 104, 106, three shunt inductors 108, 110, 112, two series inductors 114, 116, and a transition portion 118. Each of the listed components 102-116 can be fabricated using at least one conductive material, such as metal (e.g., gold, nickel, aluminum, copper, chromium, titanium, tungsten, platinum, and/or silver). Inductors are well known in the art, and therefore will not be described in detail herein. However, an exemplary shunt varactor will be described below in relation to FIG. 4. Notably, in some scenarios, the RF filter 100 exhibits a 1.9 dB insertion loss across a 300 MHz bandwidth. This is a significant insertion loss improvement over conventional RF filter designs, such as those described above in the background section of the document.

The transition portion 118 is configured to electrically connect the RF filter 100 to external systems. Accordingly, the transition portion 118 comprises a ground structure 120 and a center conductor 122. The center conductor 122 is electrically connected to the shunt varactors 102, 104, 106 at points 190, 192, 194, inductors 108, 110, 112 at ends 196, 198, 199, and inductors 114, 116 at their outer ends and center ends. Conductive structures 154 are provided to facilitate the electrical connection of the center conductor 122 to the center ends of the inductors 114, 116. Similarly, the ground structure 120 is electrically connected to the shunt varactors 102, 104, 106 via grounding portions 150 and inductors 108, 110, 112 via grounding portions 152.

Operation of inductors is well known in the art, and therefore will not be described herein. Operation of the shunt varactors 102, 104, 106 will be described below in relation to FIGS. 4-5. Still, it should be understood that each shunt varactor 102, 104, 106 comprises interdigitated drive comb structures and a truss comb structure. A voltage (e.g., 90 Volts) is applied to the drive comb structures via the center conductor 122 such that a gap between each drive comb structure and the truss comb structure is varied. For example, in some scenarios, the gap between respective comb structures is varied between 20 microns down to 5 microns. Notably, the drive comb structures 170, 172 of each shunt varactor 102, 104, 106 are electrically connected to each other via a respective structure 180.

As shown in FIG. 1, the ground structure 120 comprises a plurality of straight portions defined by a three dimensional hollow structure with a generally rectangular cross-sectional profile. Notably, the three dimensional hollow structure can have a cross-sectional profile other than a rectangular cross-sectional profile. The center conductor 122 is disposed within the three dimensional hollow structure. In some scenarios, the center conductor 122 is suspended therein so as to extend along a center axis of each straight portion of the ground structure 120. Accordingly, the center conductor 122 is encompassed by the ground structure 120 along at least a portion of its length and separated from the ground structure 120 via a gas gap 124 on all sides thereof. The gas can include, but is not limited to, air or a dielectic gas. The center conductor 122 and ground structure 120 are fabricated using at least one conductive material, such as metal (e.g., gold, nickel, aluminum, copper, chromium, titanium, tungsten, platinum, and/or silver).

In some scenarios, the center conductor 122 is suspended within the ground structure 120 via one or more dielectric straps (not shown in FIG. 1) connected between opposing sidewalls of the ground structure 120. For example, a dielectric strap can be connected between sidewalls 160, 162 of the ground structure 120 so as to mechanically support and/or suspend at least a portion of the center conductor 122 disposed within section 164 of the ground structure 120. In some scenarios, a plurality of dielectric straps is disposed along the entire length of each straight portion of the ground structure 120.

The ground structure 120 also comprises isolation portions 101, 103, 105, 107, 109, 111, 113, 115 each defined by a plurality of sidewalls (e.g., two, three or four sidewalls). Each isolation portion 101, 103, 105, 107, 109, 111, 113, 115 at least partially surrounds a respective component 102, 104, 106, 108, 110, 112, 114, 116 so as to electrically isolate the same from other adjacent components. For example, as shown in FIG. 1, the ground structure 120 surrounds four sidewalls of each inductor 108-116. The ground structure 120 also surrounds three sidewalls of each shunt varactor 102-106. Embodiments of the present invention are not limited in this regard. Alternatively, the ground structure 120 can surround one or more sidewalls of one or more inductors 108-116 and/or shunt varactors 102-106.

In some scenarios, a space 151 is provided between adjacent sidewalls 130/132, 134/136, 138/140, 142/144 of the ground structure 120. Notably, the space 151 has dimensions selected for ensuring that adjacent electronic components are placed in close proximity to each other. For example, in some scenarios, the adjacent sidewalls 130/132, 134/136, 138/140, 142/144 are spaced 0.1-1.0 mm from each other. In other scenarios, no space 151 is provided between adjacent sidewalls 130/132, 134/136, 138/140, 142/144. Alternatively a single sidewall of the ground structure 120 (or a "common sidewall") is used to separate two adjacent components 102/110, 102/114, 104/112, 104/114, 104/116, 106/116, 108/104, 108/114, 110/106, 110/114, 110/116, 112/116. In this case, the single sidewall has a thickness that is the same as or greater than that of one adjoining sidewalls of the ground structure 120. The other adjoining sidewalls include, but are not limited to, a sidewall of the ground structure to which the common sidewall is adjacent and directly connected.

In some scenarios, the RF filter 100 has an overall size of 3.6 mm by 4.8 mm. Accordingly, each shunt varactor 102, 104, 106 has a size of 1.1 mm by 1.4 mm. Each shunt inductor 108, 110, 112 has a size of 1.1 mm by 1.1 mm. Embodiments of the present invention are not limited to the particularities of such scenarios. However, it should be reiterated that such an RF filer architecture exhibits a 1.9 dB insertion loss across a 300 MHz bandwidth. This is a significant insertion loss improvement over conventional RF filter designs, such as those described above in the background section of the document.

Notably, the RF filter 100 can be fabricated using a process which allows the RF filter 100 to be fabricated without the use of the high temperature required to fabricate conventional polysilicon based MEMS devices. In some scenarios, the metal material used to fabricate the RF filter 100 and the metal material used to fabricate an IC have melting points that are the same (e.g., a values ≤100° C.) or that have no more than a 100° C. difference. Embodiments of the present invention are not limited to the melting point particularities of these scenarios. An exemplary fabrication process will be described below in relation to FIGS. 9A-9Z.

The fabrication process also allows the RF filter 100 to be formed so as to be suspended above a substrate 200. As will be described below, the RF filter 100 is at least partially suspended above the substrate 200 via an isolation platform and resilient interconnections with external circuitry. Substrate 200 can include, but is not limited to, a flat semiconductor wafer. In this regard, a gas gap 202 is provided between the RF filter 100 and the substrate 200.

By suspending the RF filter 100 above the substrate 200, valuable space on the surface of the substrate 200 is made available for other circuitry 214, thereby providing a more compact MEMS device as compared to conventional MEMS devices including RF filters. Notably, there is relatively minimal coupling (cross talk) of a signal traveling through the filter onto circuitry 214 formed below on the substrate 200. For example, in some scenarios, the isolation is greater than 40 dB across 6 GHz.

Figure 3:
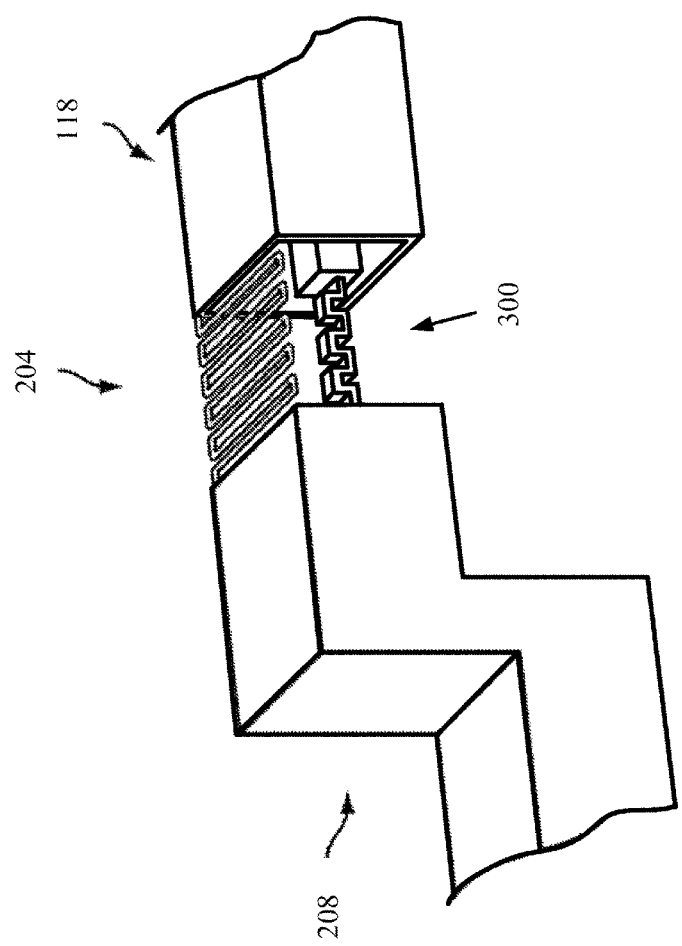
FIG. 3 is a schematic illustration which is useful for understanding an exemplary interconnection between a MEMS RF filter device and an external circuit.

Notably, the RF filter 100 is isolated from the substrate 200 via resilient interconnections 204, 206. The interconnections 204, 206 between the RF filter 100 and an external device (e.g., a switch) may be designed to ensure that vibrations from the environment are not coupled to the RF filter 100. In this regard, at least a portion of each interconnection 204, 206 may be designed to move in the directions of the vibrations. Such an interconnection design can include, but is not limited to: a wire bond (not shown) or a spring (e.g., spring 300 of FIG. 3) interconnection electrically connecting the center conductor 122 of the transition portion 118 to a center conductor of a transition portion 208, 210 coupled to the substrate 200; and/or a plurality of spring interconnections 212 electrical connecting each of the four sidewall of the ground structure 120 to respective sidewalls of the respective transition portion 208, 210 coupled to the substrate 200. Alternatively or additionally, the material used to form interconnections 204, 206 between the transition portion 118 is formed from a material with a relatively low mechanical stiffness.

Figure 4:
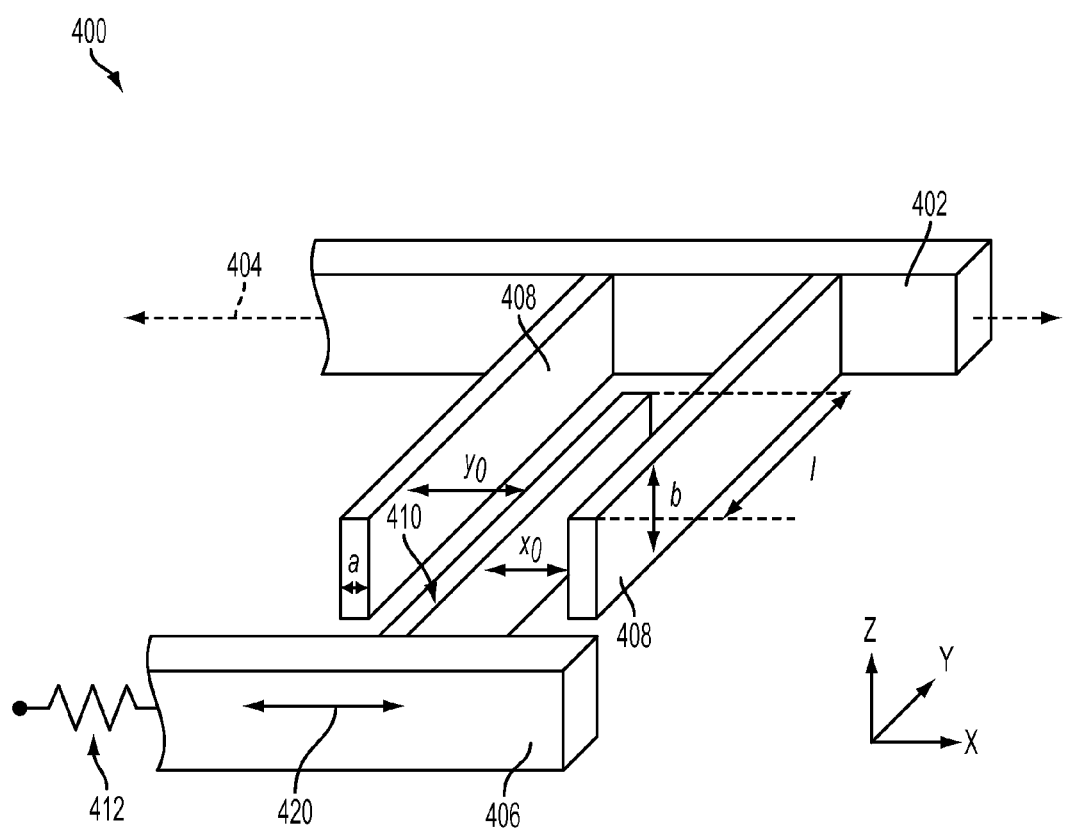
FIG. 4 is a schematic illustration of an exemplary architecture for a MEMS shunt varactor that is useful for understanding the present invention.

Referring now to FIG. 4, there is provided a schematic illustration of an exemplary architecture for a drive portion 400 of a shunt varactor. Each of the shunt varactors 102, 104, 106 of FIG. 1 can have a drive portion that is the same as or similar to that of FIG. 4. Drive portion 400 includes a drive comb structure 402 having a fixed position and extending along a longitudinal axis 404. Drive portion 400 also includes a truss comb structure 406 that extends substantially parallel to axis 404 and that can elastically move in the x direction along a motion axis 420 substantially parallel to axis 404 of the drive comb structure 402. For example, as shown in FIG. 4, truss comb structure 406 can include or be attached to at least one restorative or resilient component 412 connected to a fixed end. The resilient component 412 restores a position of truss comb structure 406 when no external forces are being applied. The drive comb structure 402 can have one or more drive fingers 408 extending therefrom towards truss comb structure 406. The truss comb structure 406 can similarly include one or more truss fingers 410 extending therefrom towards the drive comb structure 402.

As shown in FIG. 4, the drive comb structure 402 and the truss comb structure 406 can be positioned to be interdigitating. The term "interdigitating", as used herein with respect to comb structures, refers to arranging comb structures such that the fingers extending from such comb structures at least partially overlap and are substantially parallel.

In the exemplary architecture of FIG. 4, fingers 408 and 410 can each have a width and a height of a and b, respectively, and an overlap length of l. Although comb structures with multiple sets of fingers can be configured to have the same dimensional relationships (width, height, and overlap), the present invention is not limited in this regard and dimensional relationships can vary, even within a single shunt varactor. Furthermore, the portion shown in FIG. 4 and the dimensional relationship shown in FIG. 4 are only the electrically conductive portions of drive portion 400. As one of ordinary skill in the art will recognize, comb structures can further include structural portions comprising non-conductive or semi-conductive materials extending in the z direction to provide structural support for the conductive portions shown in FIG. 4.

The drive portion 400 shown in FIG. 4 operates on the principle of electrostatic attraction between adjacent interdigitating fingers. That is, motion of the truss comb structure 406 can be generated by developing a voltage difference between the drive comb structure 402 and the truss comb structure 406. In the case of drive portion 400, the voltages applied at comb structures 402, 406 are also seen at fingers 408, 410, respectively. The resulting voltage difference generates an attractive force between fingers 408 and 410. If the generated electrostatic force between fingers 408 and 410 is sufficiently large to overcome the other forces operating on truss comb structure 406 (such as a spring constant of resilient component 412), the electrostatic force will cause the motion of the truss comb structure 406 between a first interdigitated position (resting position at a zero voltage difference) and a second interdigitated position (position at a non-zero voltage difference) among motion axis 420. Once the voltage difference is reduced to zero, resilient component 412 restores the position of truss comb structure 406 to the first interdigitating position.

As shown in FIG. 4, each finger 410 in truss comb structure 406 can be disposed between two fingers 408 of drive comb structure 402. Accordingly, an electrostatic force is generated on both sides of finger 410 when a voltage difference is developed between comb structures 402 and 406. Therefore, to ensure movement of truss comb structure 406 in only one direction in response to a voltage difference, fingers 410 are positioned with respect to fingers 408 such that the electrostatic force in a first direction along the x-axis is greater than the electrostatic force in an opposite direction in the x-axis. This is accomplished by configuring the finger spacing (i.e., spacing between fingers of interdigitated comb structures) in the first direction along the x-axis ($x_0$) and the finger spacing in the opposite direction along the x-axis ($y_0$) to be different when the voltage difference is zero. Since the amount of electrostatic force is inversely proportional to the distance between fingers, the motion of truss comb structure will be in the direction associated with the smaller of $x_0$ and $y_0$.

The drive portion 400 provides a control mechanism for horizontal actuation in a shunt varactor that can be precisely controlled by adjusting the voltage difference between the drive and truss comb structures. This allows continuous adjustment over a range of interdigitating positions (by adjusting the voltage continuously over a voltage range).

Although the drive portion described above could be coupled to any variety of devices, using such a drive portion for various types of devices will only provide a partial improvement in manufacturing robustness and device reliability. In general, the robustness of the IC fabrication techniques used for fabricating MEMS devices and other types of devices is increased by reducing the variety of feature types and dimensional variation in each layer. The present invention exploits this characteristic. In particular, another aspect of the invention is to use the comb structure drive portion in conjunction with a comb structure based varactor portion, as shown below in FIG. 5.

Figure 5:
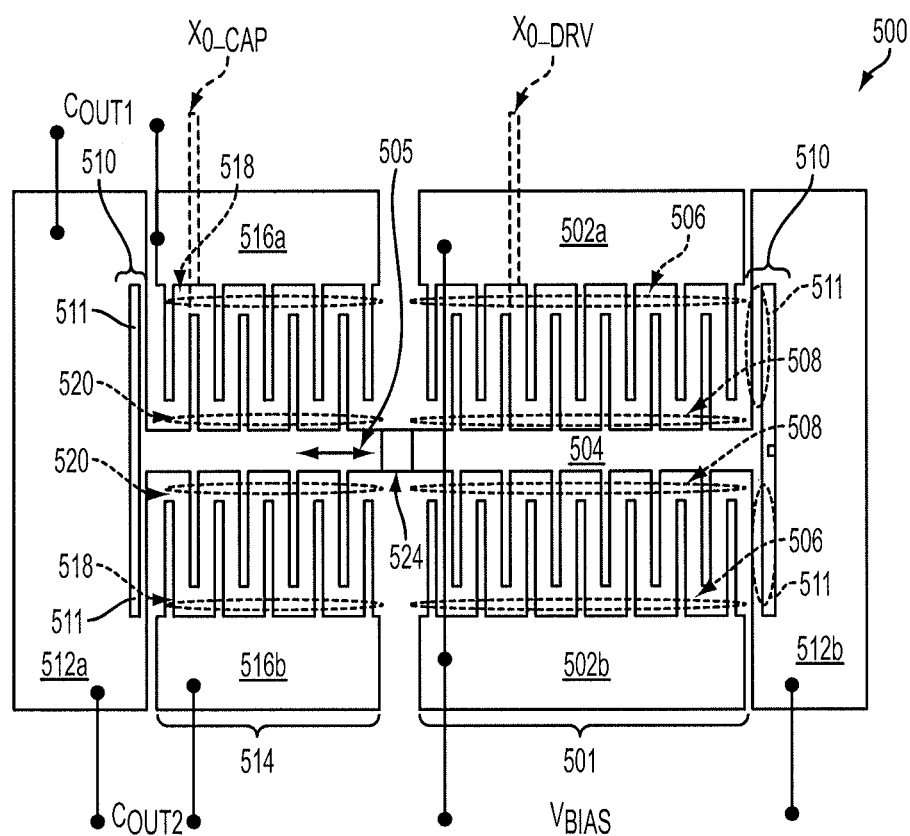
FIG. 5 is a top-down view of an exemplary MEMS shunt varactor that is useful for understanding the present invention.

FIG. 5 shows a top-down view of an exemplary MEMS shunt varactor 500 that is useful for understanding the present invention. Each of the shunt varactors 102, 104, 106 of FIG. 1 can be the same as or similar to the MEMS shunt varactor 500 of FIG. 5. As shown in FIG. 5, varactor 500 includes a drive portion 501, similar to the drive portion 400 described above in relation to FIG. 4. That is, drive portion 501 includes drive comb structures 502a and 502b (collectively 502), a truss comb structure 504, drive fingers 506, and truss fingers 508.

Truss comb structure 504 also includes resilient portions 510 with fixed ends 512a and 512b (collectively 512). Resilient portions 510 comprise resilient or flexible reed structures 511 mechanically coupling truss comb structure 504 to fixed ends 512. Therefore, a leaf spring structure is effectively formed on the two ends of truss comb structure. In operation, as a force is exerted on truss comb structure 504 (by generating a voltage difference between fingers 506 and 508) the reed structures 511 deform to allow truss comb structure to move along motion axis 505 from a first interdigitated position to at least a second interdigitated position. Once the force is no longer being exerted, the reed structures 511 apply a restorative force to restore the position of the truss comb structure 504 to a first interdigitated position. The operation and configuration of components 502-510 is substantially similar to that of components 402, 406, 408, 410, 412 of FIG. 4. Therefore, the discussion of FIG. 4 is sufficient for describing the operation and configuration for components 502-510 of FIG. 5. As described above, in addition to the drive portion 501, varactor 500 also includes a variable capacitor or varactor portion 514, as shown in FIG. 5. The varactor portion 514 includes input/output comb structures 516a and 516b (collectively 516) having a fixed position. The input/output comb structures 516 can also have one or more sense fingers 518 extending therefrom. Within the varactor portion 514 of varactor 500, the truss comb structure 504 can additionally include one or more additional truss fingers 520 extending therefrom and interdigitating sense fingers 518. Therefore, the truss comb structure 504 interdigitates (via fingers 508 and fingers 520) both the drive fingers 506 and the sense fingers 518. As a result, the truss comb structure 504 mechanically connects and is part of both the drive portion 501 and the varactor portion 514.

Fingers 506, 508, 518 and 520 are shown to be similarly dimensioned and having a same amount of overlap. However, the invention is not limited in this regard and dimensional relationships can be different in the drive portion 501 and varactor portion 514. Furthermore, the dimensional relationship can also vary within the varactor portion 514. Additionally, as described above with respect to FIG. 4, the comb structures 502, 504 and 516 can further include conductive portions and structural portions, comprising non-conductive or semi-conductive materials, to provide structure support for the conductive portions.

As described above, varactor 500 is configured to provide functionality as a variable capacitor or varactor. In particular, the truss comb structure 504 is configured to provide an adjustable capacitance based on adjustment of the gap between the first capacitor plate, provided by fingers 518, and a second capacitor plate, provided by fingers 520. Therefore, varactor 500 forms a first adjustable capacitor or varactor between truss comb structure 516a and truss comb structure 504, with a capacitance of $C_{OUT1}$, and a second adjustable capacitor or varactor between comb structure 516b and truss comb structure 504, with a capacitance of $C_{OUT2}$.

These first and second varactors can be used separately or in combination. In combination, these varactors can be connected to provide capacitance in series or parallel. For example, to provide a series capacitance, the capacitance can be measured between comb structures 516a and 516b. In contrast to provide a parallel capacitance, the capacitance can be measured between comb structures 516a, 516b and fixed end 512a (if electrically coupled to fingers 520).

In some scenarios, a discontinuity 524 is provided to isolate fingers 520 from fingers 508. As described above, the discontinuity 524 can be provided to reduce any interference between the varactor portion 514 and the drive portion 501. For example, to prevent the charge stored between fingers 518 and 520 from affecting a voltage difference between fingers 506 and 508 and vice versa. However, if fixed ends 512a and 512b are both coupled to ground, isolation between drive portion 401 and varactor portion 514 is maintained without requiring such discontinuity 524.

Varactor 500 operates as follows. A circuit (not shown) is connected to comb structures 516a, 516b, and fixed end 512a (if necessary, as described above). To increase amount of capacitance at $C_{OUT1}$ and $C_{OUT2}$, a voltage difference ($V_{BIAS}$) is developed between fingers 506 and 508 to generate electrostatic attraction between these fingers. For example, $V_{BIAS}$ is applied across drive comb structures 502 and fixed ends 512b (which is electrically coupled to fingers 508) to cause sufficient electrostatic attraction between fingers 506 and 508 to induce motion of truss comb structure 504, and consequently motion of fingers 520 towards fingers 518, reducing a spacing $X_{0\_CAP}$ between fingers 518 and 520. Consequently, the changing of the spacing between the capacitor plates results in a different capacitance value for both $C_{OUT1}$ and $C_{OUT2}$. Therefore, to increase capacitance, $V_{BIAS}$ is selected to create an electrostatic force that is at least greater than the restorative force of reed structures 511 to cause motion of truss comb structure 504 along motion axis 505. Afterwards, to decrease the capacitance, $V_{BIAS}$ is reduced such that the electrostatic force is less than the restoring force applied by reed structures 511. The restoring force then acts on truss comb structure 504 to increase the gap between fingers 520 and fingers 518, and thus lower the capacitance.

Figure 6:
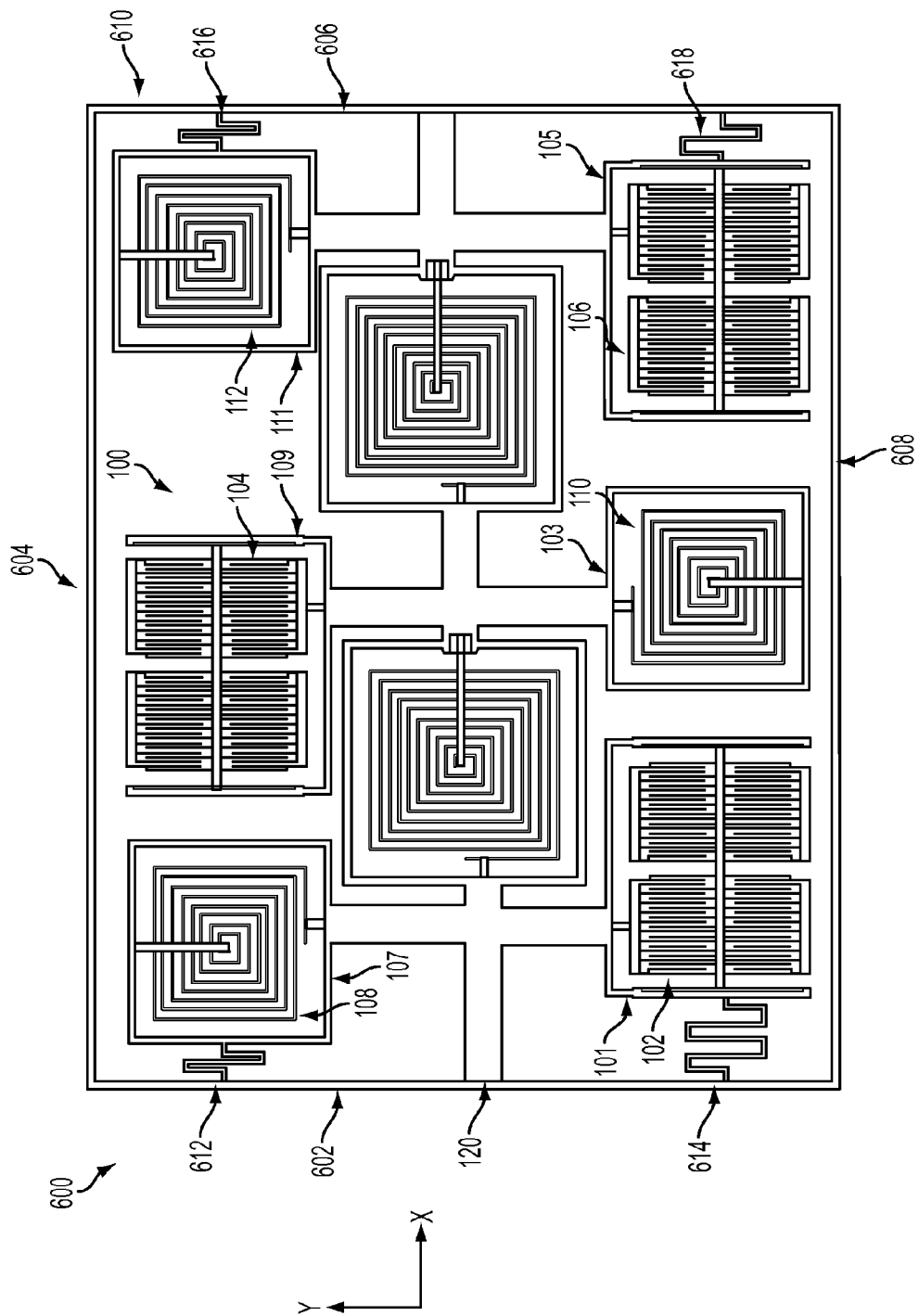
FIG. 6 is a top-down view of an exemplary MEMS RF filter with an isolation platform that is useful for understanding the present invention.

Referring now to FIG. 6, there is provided a top-down view of the RF filter 100 with an isolation platform 600 that is useful for understanding the present invention. The isolation platform 600 is configured to protect the RF filter 100 by absorbing vibrations from the external environment prior to arrival. In this regard, the isolation platform 600 is (a) coupled to the substrate 200 so as to be suspended above the substrate (as shown in FIG. 8) using one or more mechanical support structures 802, (b) coupled to the RF filter 100 so as to suspend the RF filter 100 over the substrate 200, (c) designed such that the RF filter 100 is isolated from external sources of vibration, and (d) designed to have a relatively large amount of natural damping such that damping devices are not needed.

As shown in FIG. 6, the isolation platform 600 comprises at least one sidewall framing or surrounding a periphery of the RF filter 100. For example, in some scenarios, the isolation platform 600 comprises four adjoining sidewalls 602, 604, 606, 608 defining a rectangular frame 610, as shown in FIG. 6. In other scenarios, the isolation platform 600 comprises a single sidewall (not shown) defining a circular frame (not shown) which circumscribes or encircles the periphery of the RF filter 100.

The isolation platform 600 also comprises one or more resilient components (e.g., springs) 612, 614, 616, 618 for absorbing vibrations from an external environment. The resilient components are formed from a metal material. As such, the metal resilient components (e.g., springs) 612, 614, 616, 618 store energy when compressed. However, the stored energy is not or only minimally coupled to the RF filter when the resilient components return to their pre-stressed shapes. This is because metal resilient components (e.g., springs) have a relatively large amount of natural damping in them. Accordingly, the amplitude of vibration is decreased by the resilient components (e.g., springs) 612, 614, 616, 618. Consequently, the force exerted when the resilient components (e.g., springs) 612, 614, 616, 618 return to their pre-stressed shapes is not proportional to the amount it is compressed.

Each resilient component 612, 614, 616, 618 is coupled between the frame 610 and a respective isolation portion 101, 103, 105, 107, 109, 111, 113, 115 of the ground structure 120. As such, the isolation platform 600 is grounded. The resilient components isolate the varactors 102, 104, 106 from vibrations in at least the x direction. In this regard, it should be understood that the leaf springs of the varactors are designed to have a low actuation voltage. As such, the leaf springs are relatively stiff in the y direction and z direction, and therefore are not or only minimally susceptible to vibrations in those directions. However, the leaf springs are relatively flexible in the x direction, and therefore are susceptible to vibrations in that direction. Therefore, the resilient components 612, 614, 616, 618 of the isolation platform 600 provide a means for isolating the x direction vibrations from the varactors such that their performances are not affected thereby. In scenarios where the leaf springs of the varactors are susceptible to vibrations in the y and/or z directions, the isolation platform 600 can include additional resilient components (not shown) for absorbing such y and/or z direction vibrations prior to reaching the RF filter 100. For example, the isolation platform 600 can alternatively or additionally include resilient components (not shown) coupled to sidewall 604 and/or sidewall 608.

The resilient components 612, 614, 616, 618 are designed to have the same or different shapes, geometries, and/or orientations. For example, as shown in FIG. 6, the resilient components 612, 616 and 618 have the same orientations. Resilient components 612, 616 and 618 have the same serpentine shape. However, resilient component 614 has a different serpentine shape than that of resilient components 612, 616, 618. Embodiments of the present invention are not limited in this regard.

The RF filter 100 and the isolation platform 600 can be simultaneously fabricated using a process which allows the structures thereof to be fabricated without the use of the high temperature required to fabricate conventional polysilicon based MEMS devices. In some scenarios, the metal material used to fabricate the RF filter 100, the metal material used to fabricate an IC, and the metal material used to fabricate the isolation platform 600 have melting points that are the same (e.g., a values ≤100° C.) or that have no more than a 100° C. difference. For example, in some scenarios, the RF filter, IC and isolation platform are fabricated using the same metal material. Embodiments of the present invention are not limited to the melting point particularities of these scenarios.

Figure 7:
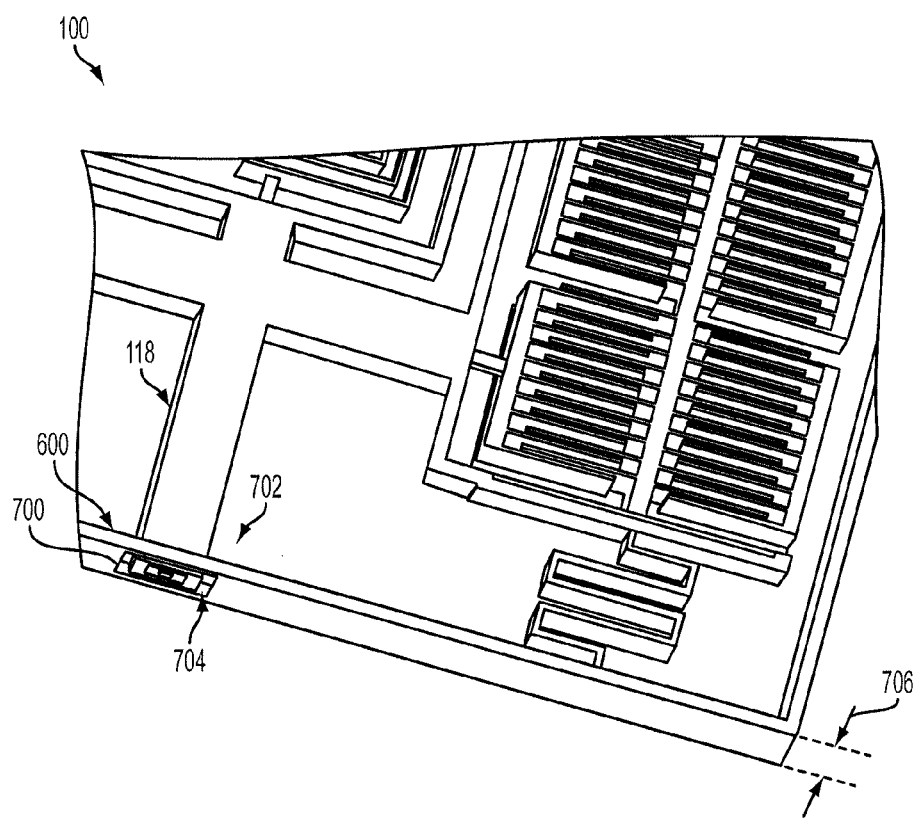
FIG. 7 is a perspective view of a portion of an exemplary MEMS RF filter with an isolation platform that is useful for understanding the present invention.

Referring now to FIG. 7, there is provided a perspective view of a portion of the RF filter 100 with the isolation platform 600 that is useful for understanding the present invention. As shown in FIG. 7, the frame 610 has an aperture 700 formed therethrough at a location where a first terminal 702 (e.g., an input terminal) of the transition portion 118 of the RF filter 100 resides. Although not shown in FIG. 7, another aperture is formed through the frame 610 at a location where a second terminal (e.g., an output terminal not shown in FIG. 7) of the transition portion 118 of the RF filter 100 resides. Each aperture 700 is sized and shaped to allow the transition portion 118 to pass therethrough, and also to provide a gas gap 704 between all sides of the transition portion 118 and the frame 610. The gas gap 704 ensures that vibrations from the external environment (e.g., the external transition portion and/or external electronic component to which the transition portion is electrically connected) are not directly coupled from the isolation platform 600 to the RF filter 100.

The height 706 of each sidewall of the frame 610 can be the same as or different than the overall height of one or more components of the RF filter 100. For example, as shown in FIG. 7, height 706 of each sidewall of the frame 610 is greater than that of the inductors 108, 110, 112, 114, 116 and the transition portion 118, but less than that of the varactors 102, 104, 106. Embodiments of the present invention are not limited to the particularities of this example architecture.

Figure 9A:
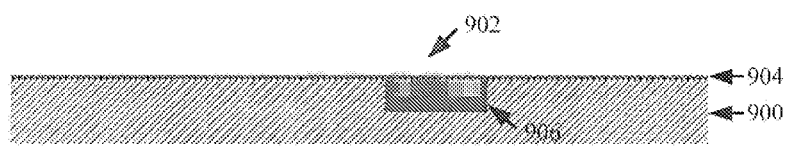
FIGS. 9A-9Z show partial cross-sections of components of a MEMS device during various steps of a fabrication process in accordance with embodiments of the present invention.

The RF filter structure described above can be fabricated using a MEMS fabrication technique. This is illustrated in FIGS. 9A-9Z. FIGS. 9A-9Z show partial cross-sections of certain components of a MEMS device (e.g., the MEMS device shown in FIGS. 5-8) during various steps of a fabrication process. Notably, the fabrication process described below in FIGS. 9A-9Z is sufficient for understanding how an entire MEMS device can be fabricated in accordance with embodiments of the present invention.

Manufacture of the MEMS device begins with the formation of an interface layer 902 on a substrate 900. An isolation layer 904 may also exist on the substrate 900. After the formation of the interface layer 902, various steps are performed to fabricate an RF filter with an isolation platform that is suspended above the electronic circuit 900. These steps are described below in relation to FIGS. 9B-9Z.

Figure 9B:
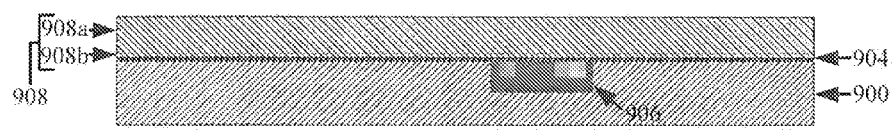
Figure 9C:
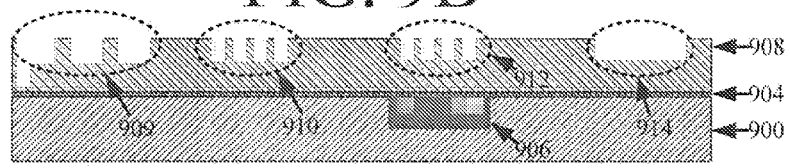
Figure 9D:
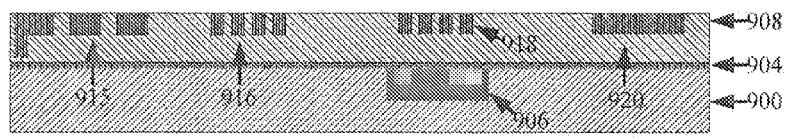

As shown in FIG. 9B, a first and second resist layer 908a and 908b (collectively 908) is disposed on the top surface of the substrate 900 so as to cover the electronic circuitry 906. Next, the second resist layer 908b is patterned to form at least partially an isolation platform (e.g., isolation platform 600 of FIG. 6), shunt varactors (e.g., a shunt varactor 102, 104 and/or 106 of FIG. 1), inductors (e.g., inductor 108, 110, 112, 114 and/or 116 of FIG. 1), and a transition portion (e.g., transition portion 118 of FIG. 1) of the RF filter (e.g., RF filter 100 of FIG. 1). A schematic illustration of second resist layer 908b which has been patterned is provided in FIG. 9C. As shown in FIG. 9C, at least four patterns have been formed in the second resist layer 908b. A first pattern 909 is provided for forming a frame and a resilient component of the isolation platform. A second pattern 910 is provided for forming a lower portion of a comb structure of a shunt varactor. A third pattern 912 is provided for forming a lower portion of an inductor coil. A fourth pattern 914 is provided for forming a lower portion of a transition portion. Therefore, each pattern 909, 910, 912, 914 is then filled with a conductive material 915-920, as shown in FIG. 9D.

Notably, the relative orientations and spacing between the patterns 909, 910, 912, 914 have simply been selected for ease of explanation. Embodiments of the present invention are not limited to the relative orientations and component spacing shown in FIGS. 9B-9Z.

Figure 9E:
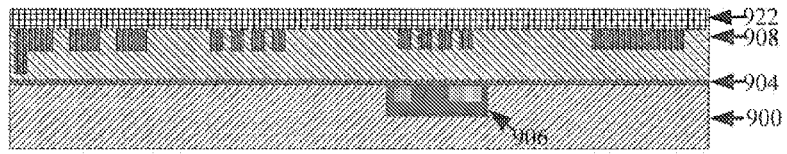
Figure 9F:
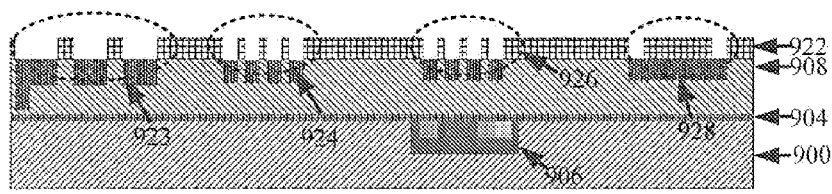
Figure 9G:
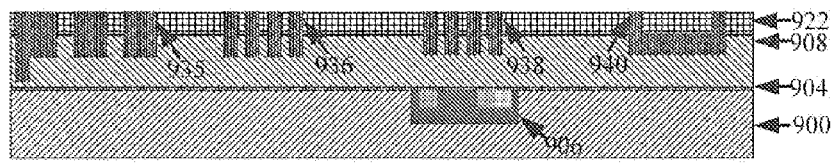

In FIG. 9E, a third resist layer 922 is disposed over the resist layers 908 and conductive material 915-920. The third resist layer 922 is then patterned in FIG. 9F for forming at least a portion of a middle section of the isolation platform, comb structure, inductor coil, and transition portion. As such, four patterns 923-928 are formed in the third resist layer 922. Pattern 923 is provided for forming a portion of a middle section of the frame and resilient component of the isolation platform. Pattern 924 is provided for forming a portion of middle section of the comb structure of the shunt varactor. Pattern 926 is provided for forming a portion of a middle section of an inductor coil. Pattern 928 is provided for forming a portion of a middle section of a transition portion. Therefore, each pattern 923-928 is then filled with the conductive material 935-940, as shown in FIG. 9G.

Figure 9H:
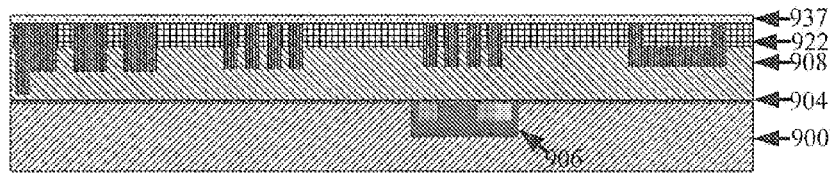
Figure 9I:
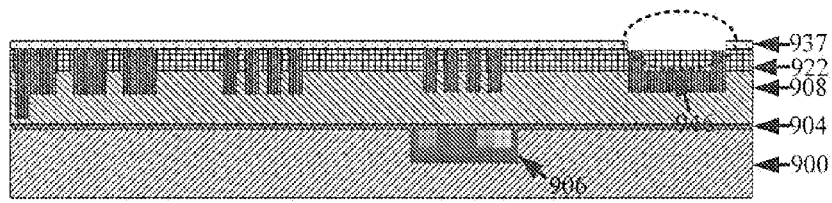
Figure 9J:
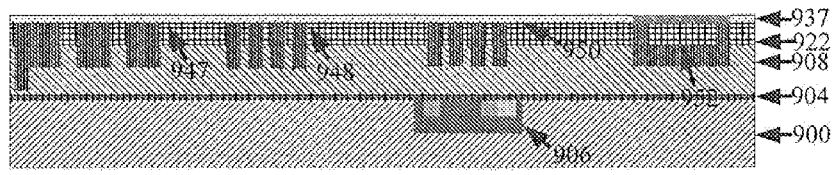

In FIG. 9H, a fourth resists layer 937 is disposed over the third resist layer 922 and conductive material 935-940. The fourth resists layer 937 is then patterned in FIG. 9I for forming a dielectric strap which will support a center conductor (e.g., center conductor 122 of FIG. 1) within the ground structure (e.g., ground structure 120 of FIG. 1) of the transition portion. Therefore, pattern 946 is filled with a non-conductive material 952 as shown in FIG. 9J.

Figure 2:
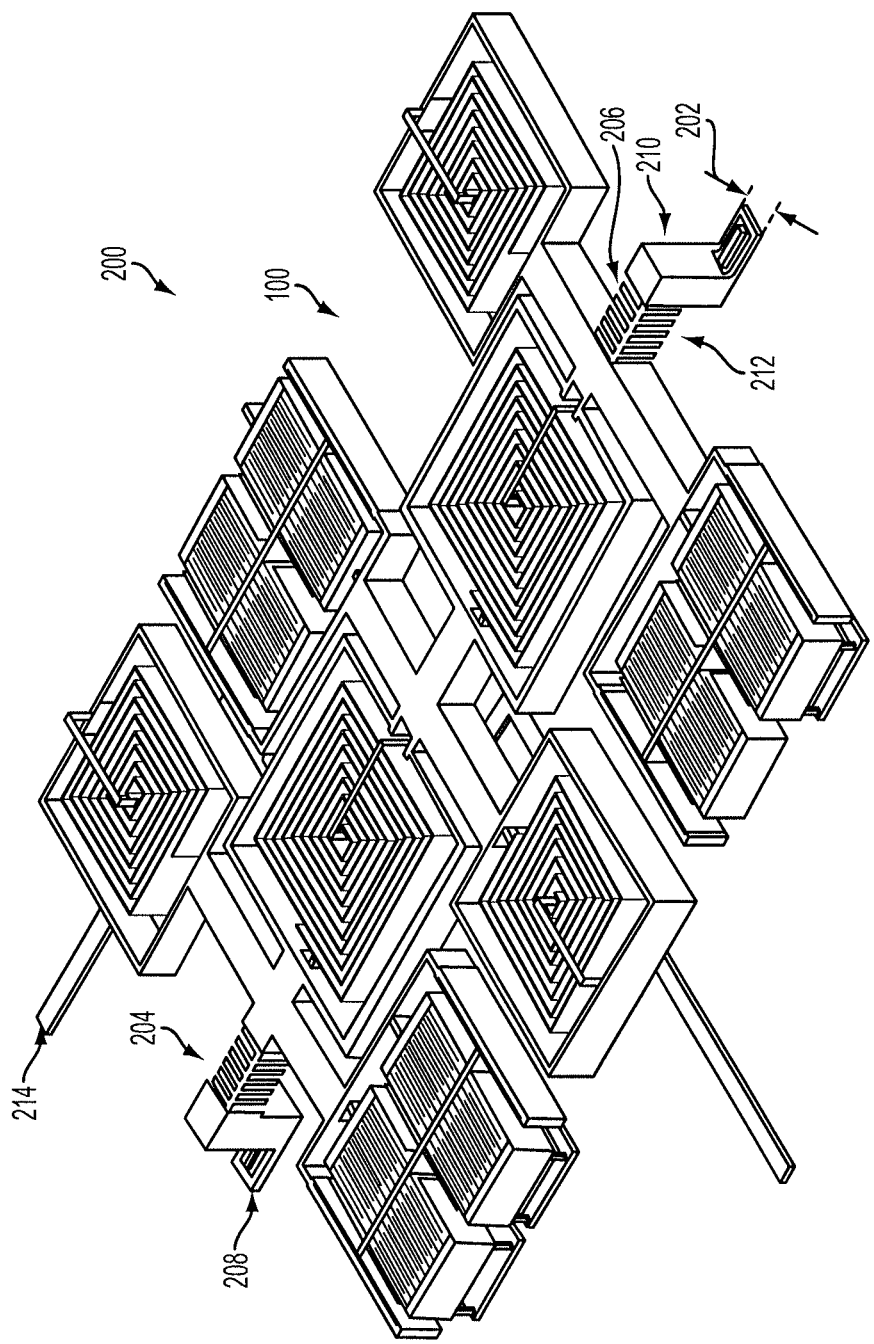
FIG. 2 is a top perspective view of an exemplary MEMS RF filter fabricated on a substrate that is useful for understanding the present invention.
Figure 9K:
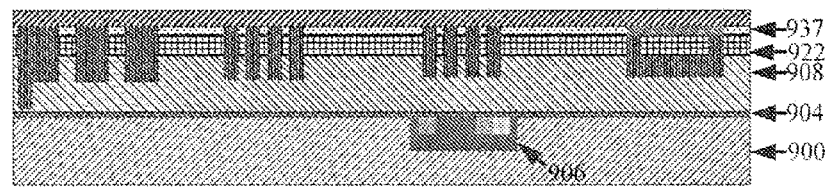
Figure 9L:
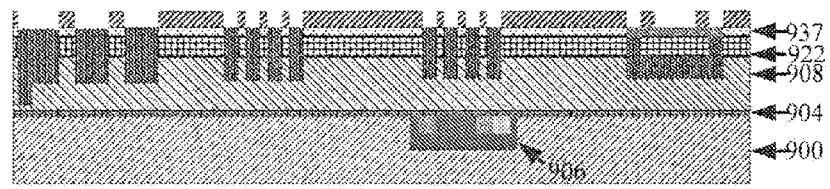
Figure 9M:
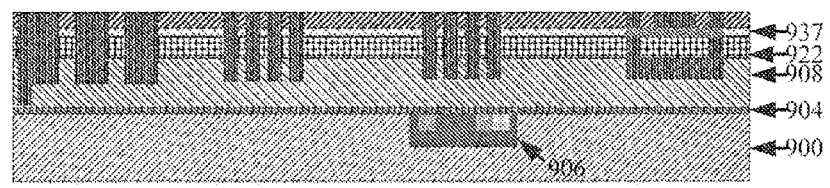
Figure 9N:
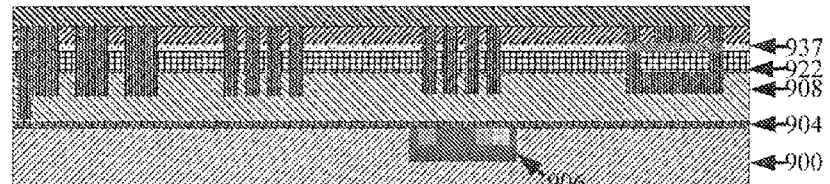
Figure 9O:
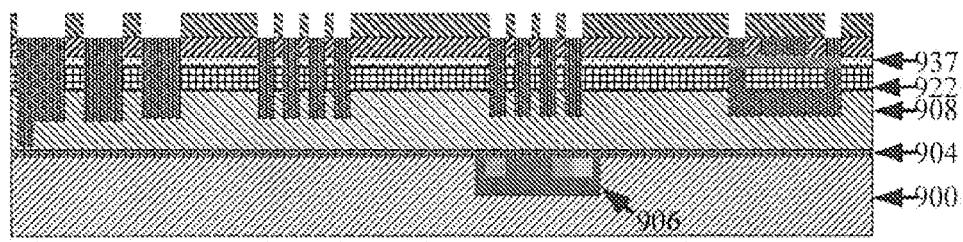
Figure 9P:
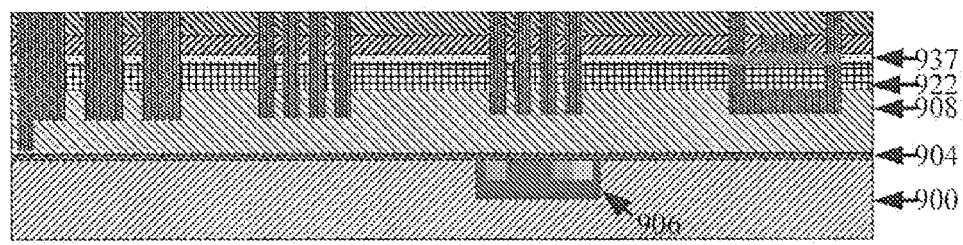
Figure 9Q:
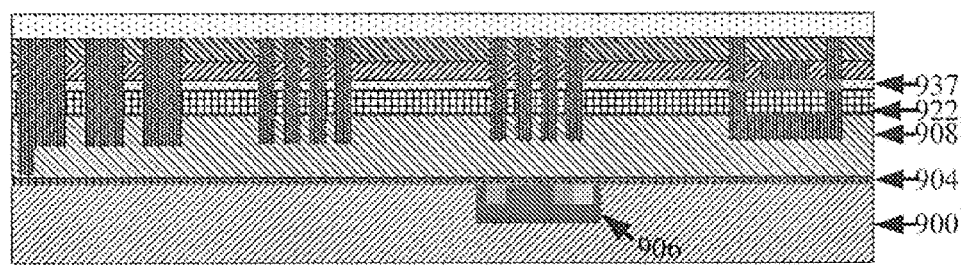
Figure 9R:
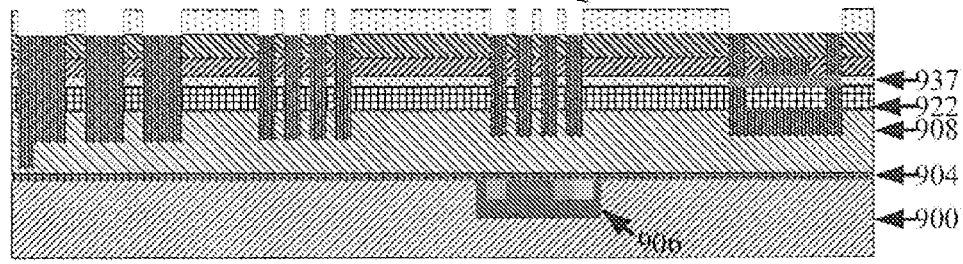
Figure 9S:
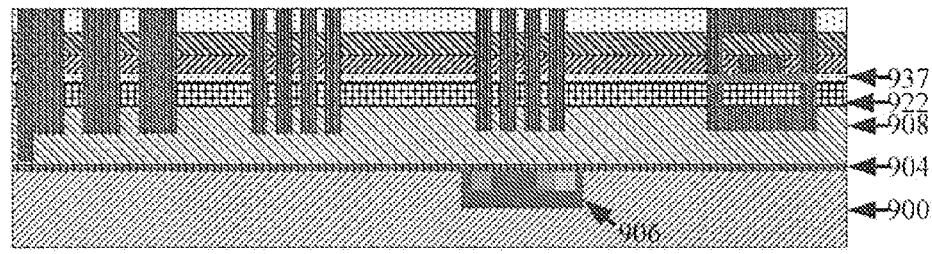
Figure 9T:
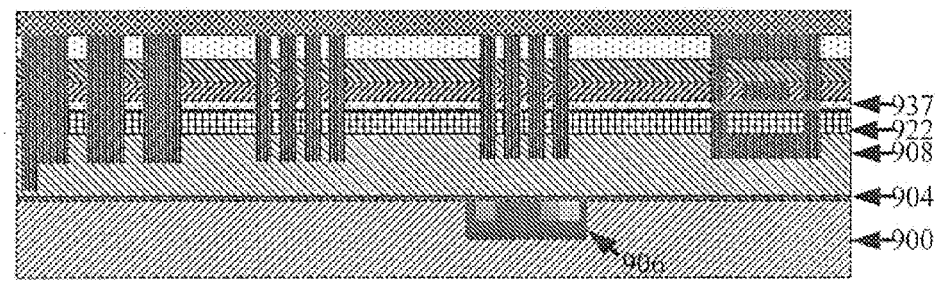
Figure 9U:
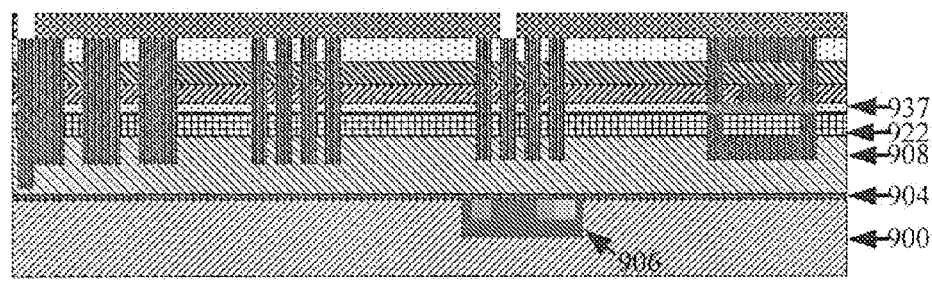
Figure 9V:
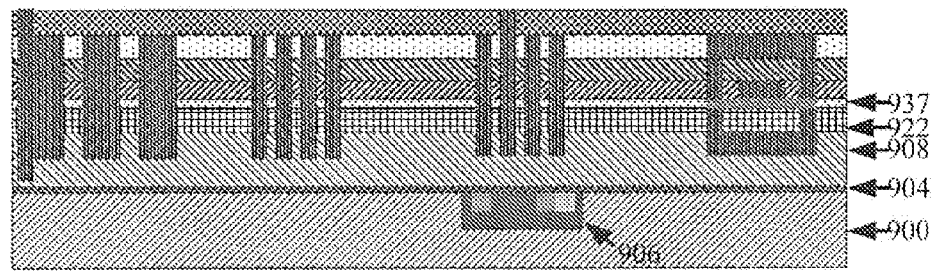
Figure 9W:
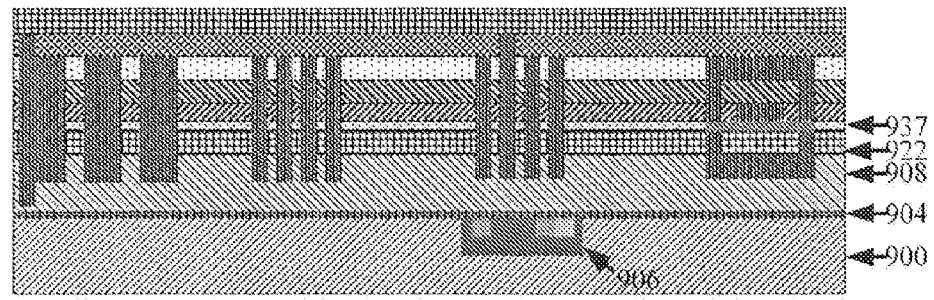
Figure 9X:
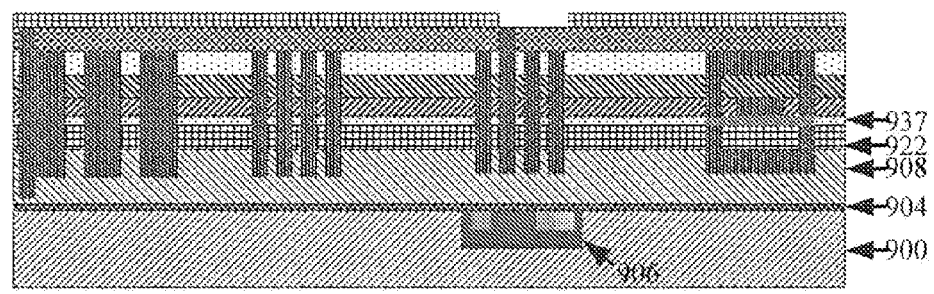
Figure 9Y:
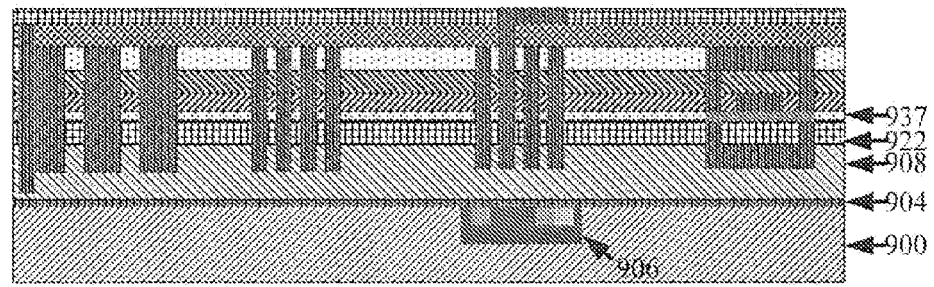
Figure 9Z:
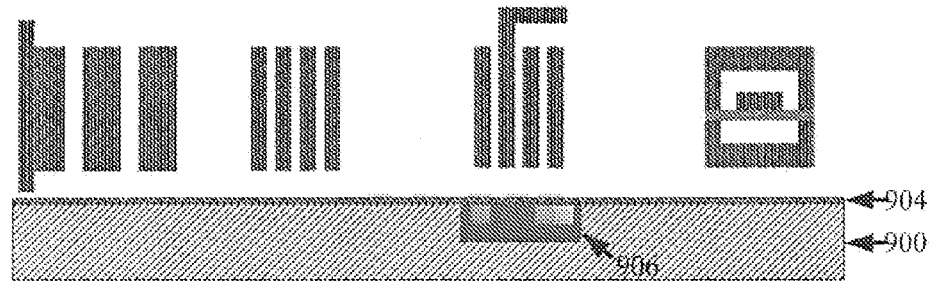

This process of disposing, patterning and filling of resists layers is repeated as shown in FIGS. 9K-9Y until the RF filter structure of FIG. 9Y is formed. Subsequently, the resist layers are removed as shown in FIG. 9Z. As a result of removing the resists layers, the RF filter structure with the isolation platform is suspended over the substrate 900. The RF filter is electrically isolated from the electronic circuitry 906 via a gas. A schematic illustration of an exemplary RF filter suspended over a substrate is shown in FIG. 2 which was discussed above. A schematic illustration of an exemplary RF filter with an isolation platform is provided in FIGS. 6-8.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

We claim:

1. An integrated Microelectromechanical System ("MEMS") device, comprising:
a substrate;
a MEMS filter device mechanically suspended above a major surface of the substrate;
a first gas gap between the major surface of the substrate and the MEMS filter device; and
an isolation platform mechanically connected to the substrate and comprising a frame structure framing a periphery of the MEMS filter device and at least one first resilient component coupled between the frame structure and the MEMS filter device, where the isolation platform absorbs vibrations from an environment prior to reaching the MEMS filter device.

2. The integrated MEMS device according to claim 1, further comprising at least one external system connected to the MEMS filter device via a resilient interconnection that is movable in at least one direction of the vibrations.

3. The integrated MEMS device according to claim 1, wherein the isolation platform is electrically coupled to ground.

4. The integrated MEMS device according to claim 1, wherein the MEMS filter device comprises a transition portion having a first portion passing through at least one aperture formed through the frame structure of the isolation platform.

5. The integrated MEMS device according to claim 4, further comprising a second gas gap between the first portion of the transition portion and the sidewalls of the aperture formed through the frame structure.

6. The integrated MEMS device according to claim 1, further comprising:
a transition portion coupled to and at least partially extending transversely away from a major surface of the substrate;
at least one second resilient component electrically connecting the transition portion to the MEMS filter device;
wherein the MEMS filter device is mechanically suspended above said major surface of the substrate by the isolation platform and the second resilient component.

7. The integrated MEMS device according to claim 6, wherein the transition portion electrically couples the MEMS filter device to electronic circuitry external thereto.

8. The integrated MEMS device according to claim 1, wherein electronic circuitry is formed on the major surface of the substrate so as to reside between the substrate and the MEMS filter device, wherein a gas gap exists between the electronic circuitry and the MEMS filter device.

9. The integrated MEMS device according to claim 8, wherein a first conductive material used to fabricate at least one of the MEMS filter device and the isolation platform has a first melting point that is different from second melting points of all second conductive material used to form the electronic circuit by no more than 100° C.

10. The integrated MEMS device according to claim 8, wherein the MEMS filter device comprises at least two adjacent electronic elements which are electrically isolated from each other via a ground structure of a transition portion.

11. The integrated MEMS device according to claim 1, further comprising a transition portion comprising a three dimensional hollow ground structure in which an elongate center conductor is suspended.

12. A method for making an integrated Microelectromechanical System ("MEMS") device, comprising:
mechanically suspending a MEMS filter device above a major surface of a substrate;
framing a periphery of the MEMS filter device with a frame structure of an isolation platform that is mechanically coupled to the substrate;
coupling at least one resilient component between the frame structure and the MEMS filter device; and absorbing, by the resilient component, vibrations from an external environment prior to reaching the MEMS filter device.

13. The method according to claim 12, further comprising coupling electronic circuitry to the MEMS filter device via a resilient interconnection that is movable in at least one direction of the vibrations.

14. The method according to claim 12, further comprising electrically coupling the resilient component to ground.

15. The method according to claim 12, further comprising:
   forming at least one aperture through the frame structure; and
   disposing a first portion of a transition portion through the aperture.

16. The method according to claim 15, further comprising forming a gas gap between the first portion of the transition portion and the sidewalls of the aperture.

17. The method according to claim 12, further comprising:
   forming a transition portion on the substrate such that the transition portion at least partially extends transversely away from a major surface of the substrate;
   electrically connecting the transition portion to the MEMS filter device using at least one second resilient component;
   wherein the MEMS filter device is mechanically suspended above said major surface of the substrate by the isolation platform and the second resilient component.

18. The method according to claim 12, further comprising forming electronic circuitry on a major surface of the substrate so as to reside between the substrate and the MEMS filter device, wherein a gas gap exists between the electronic circuitry and the MEMS filter device.

19. The method according to claim 18, wherein a first conductive material used to fabricate at least one of the MEMS filter device, the frame structure and the resilient component has a first melting point that is different from second melting points of all second conductive material used to form the electronic circuit by no more than 100° C.

20. The method according to claim 12, further comprising forming a transition portion comprising a three dimensional hollow ground structure in which an elongate center conductor is suspended.

21. The method according to claim 12, further comprising electrically isolating at least two adjacent electronic components of the MEMS filter device from each other using a ground structure of a transition portion.

* * * * *